United States Patent
Tamaki

(10) Patent No.: US 9,768,364 B2
(45) Date of Patent: Sep. 19, 2017

(54) LIGHT EMITTING DEVICE AND METHOD OF MANUFACTURING THE SAME

(71) Applicant: NICHIA CORPORATION, Anan-shi (JP)

(72) Inventor: Hiroto Tamaki, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/718,098

(22) Filed: May 21, 2015

(65) Prior Publication Data

US 2015/0340574 A1    Nov. 26, 2015

(30) Foreign Application Priority Data

May 21, 2014   (JP) ................. 2014-105650

(51) Int. Cl.
| | | |
|---|---|---|
| H01L 33/54 | (2010.01) | |
| H01L 33/50 | (2010.01) | |
| H01L 23/00 | (2006.01) | |

(52) U.S. Cl.
CPC ............ *H01L 33/507* (2013.01); *H01L 24/97* (2013.01); *H01L 33/505* (2013.01); *H01L 33/54* (2013.01); *H01L 2224/16* (2013.01); *H01L 2924/181* (2013.01); *H01L 2933/005* (2013.01); *H01L 2933/0041* (2013.01)

(58) Field of Classification Search
CPC ...................................... H01L 24/97
See application file for complete search history.

(56) References Cited

U.S. PATENT DOCUMENTS

| | | | | |
|---|---|---|---|---|
| 6,730,857 B2* | 5/2004 | Konrad | ................. | H05K 3/465 174/255 |
| 8,212,271 B2* | 7/2012 | Kotani | ................. | H01L 33/486 257/98 |
| 8,491,816 B2* | 7/2013 | Hong | ................. | C09K 11/616 252/301.4 H |
| 8,535,961 B1* | 9/2013 | Kuo | ...................... | H01L 33/486 257/88 |
| 2005/0057144 A1 | 3/2005 | Morita et al. | | |
| 2008/0179503 A1* | 7/2008 | Camargo | ............ | H01L 31/0203 250/216 |

(Continued)

FOREIGN PATENT DOCUMENTS

| | | |
|---|---|---|
| JP | 2005-93712 | 4/2005 |
| JP | 2013-183042 | 9/2013 |
| JP | 2014-93434 | 5/2014 |

(Continued)

OTHER PUBLICATIONS

U.S. Appl. No. 14/568,256, Nichia Corporation, Unpublished.

*Primary Examiner* — Mark Tornow
(74) *Attorney, Agent, or Firm* — Mori & Ward, LLP

(57) ABSTRACT

The light emitting device is manufactured by processing that includes forming encapsulating member at least on the upper surface and upper surface perimeter of a light emitting element, removing at least the part of the encapsulating member that is on upper surface of the light emitting element and form a cavity with a perimeter that surrounds the light emitting element, and forming a wavelength-conversion layer inside the cavity to convert the wavelength of light emitted from the light emitting element.

23 Claims, 6 Drawing Sheets

(56) References Cited

U.S. PATENT DOCUMENTS

2013/0288407 A1\* 10/2013 Lo .......................... H01L 33/52
                                                                438/27
2015/0021642 A1    1/2015 Nakabayashi

FOREIGN PATENT DOCUMENTS

| JP | 2014-107307 | 6/2014 |
| WO | WO 2006/095534 | 9/2006 |

\* cited by examiner

LIGHT EMITTING DEVICE AND METHOD OF MANUFACTURING THE SAME

BACKGROUND

1. Field of the Invention

The present disclosure relates to a light emitting device that can be used in applications such as display devices, lighting apparatus, display monitors, and liquid crystal display backlighting, and to its method of manufacture.

2. Description of the Related Art

Light emitting devices provided with a package that has a cavity to hold a light emitting element, a light emitting element, and wavelength-conversion material within the cavity to convert the wavelength of light emitted from the light emitting element are previously and currently used.

See to Japanese Laid-Open Patent Publication 2005-93712.

Thin outline and miniaturization are in demand for light emitting devices, and in particular, for side-view light emitting devices.

Further developments of the light emitting device and its method of manufacturing the same are desired.

SUMMARY

The method of manufacturing the light emitting device according to one aspect of the present invention includes forming encapsulating member at least on the upper surface and upper surface perimeter of a light emitting element, removing at least the part of the encapsulating member that is on upper surface of the light emitting element to form a cavity with a perimeter that surrounds the light emitting element, and forming a wavelength-conversion layer inside the cavity to convert the wavelength of light emitted from the light emitting element.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
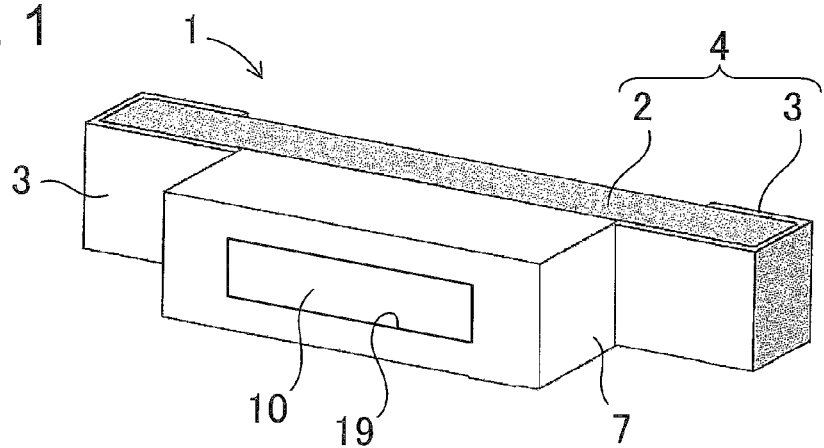
FIG. 1 is a schematic perspective view of a light emitting device for one embodiment of the present invention.

The followings describe embodiments according to some aspects of the present invention with appropriate reference to the figures. However, the light emitting device 1 described below is merely a specific example to represent the technical principles associated with the present invention, and unless otherwise specified, the present invention is not limited to the embodiments described below. Further, explanations used to describe one implementation mode or embodiment may be used in the description of other implementation modes or embodiments. Properties such as the size and spatial relation of components shown in the figures may be exaggerated for the purpose of clear explanation.

Although light emitting devices in the embodiments mainly described below are called side-view light emitting devices, the present invention is also applicable to top-view light emitting devices. In a side-view light emitting device, the mounting surface intersects with the light emitting surface. The light emitting device is provided with a substrate having base material with a pair of connecting terminals, a light emitting element, encapsulating member, and a wavelength-conversion layer.

In the present specification, the light emitting surface may be called the upper surface, surfaces adjacent to or intersecting with the light emitting surface are called side surfaces, and one of the side surfaces is called the light emitting device mounting surface. Correspondingly, among the surfaces of elements and materials that structure the light emitting device, the light emitting surface side surface (namely the upper surface) may be referred to as the first primary surface, the surface opposite the first primary surface (namely the lower surface) may be referred to as the second primary surface, and surfaces adjacent to or intersecting with the first and second primary surfaces (namely the side and end surfaces of the light emitting device) may be referred to as edge surfaces (or edges).

One object of the present invention is to provide a miniaturized light emitting device and its method of manufacture employing a wavelength-conversion layer to convert the wavelength of light emitted from the light emitting element.

The method of manufacturing the light emitting device according to one aspect of the present invention includes forming encapsulating member at least on the upper surface and upper surface perimeter of a light emitting element, removing at least the part of the encapsulating member that is on upper surface of the light emitting element to form a cavity with a perimeter that surrounds the light emitting element, and forming a wavelength-conversion layer inside the cavity to convert the wavelength of light emitted from the light emitting element.

This structure enables a thin outline miniaturized light emitting device to be produced without using a package. Specifically, a light emitting device can be made by establishing encapsulating member on upper surface of the light emitting element and its perimeter, forming a cavity with a perimeter that surrounds the light emitting element by removing the portion of encapsulating member over the light emitting element, and forming a wavelength-conversion layer, which converts the wavelength of light emitted from a light emitting element. The above and further objects of the present invention as well as the features thereof will become more apparent from the following detailed description to be made in conjunction with the accompanying drawings.

Device Substrate

The light emitting device for implementation of the embodiments can be provided with a device substrate on which the light emitting element is mounted. For example, the substrate can be structured with base material, and a pair of positive and negative connecting terminals at least on the first primary surface of the base material. The shape of the substrate corresponds to the shape of the base material described later. For example, it is preferable at least the first primary surface to be rectangular with long and short directions. The thickness of the substrate can be controlled by the thickness of the base material. For example, the thickness of the thickest part of the substrate is preferably on the order of 500 μm or less, more preferably 300 μm or less, and even more preferably 200 μm or less. It is also desirable for substrate thickness to be greater than or equal to approximately 40 μm.

The mechanical strength of the substrate can be adjusted by material selected for the base material and the connecting terminals described later. For example, substrate bending strength is preferably 300 MPa or more, more preferably 400 MPa or more, and even more preferably 600 MPa or more. This can ensure the strength of the light emitting device. The flexural strength in the present specification refers to a value measured by using a commercially available strength measuring apparatus, for example, by a three-point flexural test using a commercially available strength measuring apparatus, for example, from an Instron Corporation machine. By giving the substrate appropriate strength while making it extremely thin, a high-reliability miniaturized light emitting device can be achieved.

The plan view outline of the substrate is preferably rectangular. In the case where the light emitting device is of the side-view type, it is desirable for the plan view rectangular shape to have an aspect ratio on the order of 50 to 1, 30 to 1, 10 to 1, or 3 to 1. By making a light emitting device with a long narrow light emitting surface that extends in the lengthwise direction, light output can be increased while restraining the width (namely, the short direction dimension) of the device. For example, the lengthwise dimension can be 1 mm-50 mm, and the short direction dimension can be on the order of 0.1 mm to 0.8 mm, 0.2 mm to 0.5 mm, or 0.3 mm.

Base Material

Materials such as metals, ceramics, resins, dielectrics, pulp, glass, paper, composites of those materials (for example, resin composites), or composites of those materials with conducting materials (such as metal or carbon) can be used for the base material. Metals can include copper, iron, nickel, chrome, aluminum, silver, gold, titanium, or alloys of those individual metals. Ceramics can include aluminum oxide, aluminum nitride, zirconium oxide, zirconium nitride, titanium oxide, titanium nitride, or mixtures of those materials. Resin composites such as glass epoxy resin can be used. In particular, it is desirable for the base material to include resin. Any of the resins used in the art can be employed.

Properties such as size, shape, and thickness of the base material for a single light emitting device can be set appropriately. Although thickness depends on the materials used and on the type and structure of the light emitting element mounted on the base material, thickness on the order of 470 μm or less is preferable and 370 μm or less, 320 μm or less, and 270 μm or less are more preferable. Also considering base material strength, thickness on the order of 20 μm or more is desirable. To ensure the bending strength of the entire substrate, the base material should have strength equivalent to that previously described for the substrate. For example, base material bending strength is preferably on the order of 300 MPa or more, more preferably 400 MPa or more, and even more preferably 600 MPa or more.

While the plan view shape of the base material can be, for example, circular, rectangular, polygonal, or a shape that approximates those shapes, a rectangular shape is preferable. It is desirable for base material surface area to be greater than that of the light emitting element(s) described later. In the case where a single light emitting element is mounted on a single light emitting device, the lengthwise dimension of the light emitting device is preferably on the order of 1.5 to 5 times the length of one side of the light emitting element, and more preferably on the order of 1.5 to 3 times the length of one side of the light emitting element. In the short direction, the width of the light emitting device is preferably on the order of 1.0 to 2.0 times that of the light emitting element, and more preferably on the order of 1.1 to 1.5 times that of the light emitting element. In the case where a plurality of light emitting elements are mounted in a single light emitting device, the lengthwise dimension can be appropriately set depending on the number of light emitting elements. For example, in the case where two or three light emitting elements are mounted along the length of the light emitting device, the lengthwise dimension of the light emitting device is preferably on the order of 2.4 to 6 times or 3.5 to 7.0 times the length of one side of a light emitting element. The second primary surface of the base material may also be provided with one or more insulating, metallic, etc. layers serving various functions such as strength reinforcement, heat sinking, and marking (e.g. alignment marking).

Connecting Terminals

A pair of connecting terminals can be formed at least on the first primary surface of the substrate. In the case where the light emitting device is of the side-view type, it is desirable to form at least part of the connecting terminal edge regions coincident with part of edge regions of the first primary surface of the substrate. In other words, it is desirable for some sections of the edges of the connecting terminals and some sections of the edges of the substrate to lie in the same plane. When the light emitting device is mounted on a board (or a mounting substrate) with a surface that has coincident connecting terminal and substrate edges serving as a mounting surface, contact or maximum proximity can be achieved between connecting terminal edges and the mounting board, and mountability of the light emitting device can be improved. In the present specification, "lying in the same plane" means no or almost no step formation with a non-planarity tolerance of several microns to several tens of microns allowed. This definition is applicable for coplanar surfaces described in subsequent parts of the present specification as well.

A connecting terminal has, for example, a light emitting element connecting section on the first primary surface for connection with a light emitting element electrode, and an external connecting section to connect outside the light emitting device. It is preferable for the external connecting section to be established on the second primary surface of the substrate as well as on the first primary surface. For example, it is desirable for a connecting terminal to extend from the first primary surface to a surface between the first primary surface and the second primary surface (namely, an edge or end surface); to extend along the first primary surface and along the second primary surface; or to extend from the first primary surface to pass over a surface between the first primary surface and the second primary surface, and to extend along the second primary surface (for example, with a U-shaped cross-section). Here, although an edge or end surface means part of, or an entire surface between the first primary surface and the second primary surface, in addition to a designated surface (or part of that surface) between the first and second primary surfaces, it can also include part of one or two surfaces adjacent to that designated surface. Normally, the light emitting element connecting section is disposed on the first primary surface, and the external connecting section is disposed on the first primary surface, on the first primary surface and an edge or end surface, on the first primary surface over an edge or end surface and on the second primary surface, or on the first primary surface and the second primary surface. In the case where the connecting terminal extends over the first primary surface and the second primary surface, it does not necessarily have to pass over an edge or end surface. This is because the connecting terminal can connect via a through-hole established in the base material.

A connecting terminal does not necessarily have to have the same width (for example, the width of the substrate) extending over the first primary surface, an edge or end surface, and/or the second primary surface, and can be formed with wider or narrower parts. In addition, on the first primary surface and/or the second primary surface, part of the connecting terminal can be covered with insulating material (for example, base material or one of its constituents) that in essence narrows the width of the connecting terminal. While this type of narrowed region is preferably established at least on the first primary surface of the substrate, it can be established on both the first and second primary surfaces. In particular, it is more preferable to dispose this type of narrowed region on the first primary surface of the substrate in the vicinity of encapsulating member described later.

Establishing connecting terminal narrowed regions can restrain bonding material and flux, which is disposed on the connecting terminals, from flowing along the surface of the connecting terminals under the encapsulating member (described later) and under the light emitting element. In addition, separating the connecting terminals on the first primary surface, and in particular the light emitting element connecting sections, from the sides of the substrate can also keep bonding material and flux used when the light emitting device is mounted (described later) from flowing along the surface of the connecting terminals under the encapsulating member and under the light emitting element.

The narrowed regions are preferably narrower than the light emitting element connecting sections, and preferably are decreased the width in a gradual manner.

Besides incorporating connecting terminals that electrically connect with the light emitting element, the substrate can also include components such as heat dissipation terminals, heat sink member, and reinforcing member. These parts can be disposed on either the first primary surface, the second primary surface, or on any of the sides. In particular, these parts are preferably disposed on the second primary surface side below the light emitting element and/or the encapsulating member, which are established on the first primary surface. These additional members enable light emitting device mechanical strength and reliability to be increased. In addition, in the case where encapsulation is implemented by molding, substrate warping during molding can be reduced and manufacturability during the encapsulation process can be improved. In the case where heat dissipation terminals or reinforcement terminals are established between the connecting terminals, they are preferably covered with an insulating layer. This allows bridging to be prevented between the connecting terminals, heat dissipation terminals, and reinforcement terminals through bonding materials.

In the case where a single light emitting device incorporates a plurality of light emitting elements, one or more additional connecting terminals can be provided to electrically connect those light emitting elements. In that case, connecting terminal attributes such as the shape and position are appropriately determined depending on the number of light emitting elements mounted on a single substrate, their layout, and connection type (i.e. series or parallel).

Connecting terminals can be formed from metals such as Au, Pt, Pd, Rh, Ni, W, Mo, Cr, Ti, Fe, Cu, Al, Ag, or from single or multiple layers of alloys of those metals. Among the candidates, materials with superior conductivity and mounting ability are preferable, and materials that can wet and bond well with bonding material used to mount the light emitting device on a board or mounting substrate are even more preferable. From a heat dissipation viewpoint, copper and copper alloys are desirable. A highly light reflecting film (layer) such as silver, platinum, tin, gold, copper, rhodium, or their alloys can be formed on connecting terminal surfaces. Specifically, connecting terminals can have a layered structure such as W/Ni/Au, W/Ni/Pd/Au, W/Ni—Co/Pd/Au, Cu/Ni/Cu/Ni/Pd/Au, Cu/Ni/Pd/Au, Cu/Ni/Au, Cu/Ni/Ag, Cu/Ni/Au/Ag. The thickness or the number of layers incorporated can be locally different.

Connecting terminals can have protrusions 3a for connection with the first and second electrodes of the light emitting element. This makes it easy for encapsulating member to fill space between the light emitting element and the substrate, and can prevent emitted light from being transmitted towards the substrate. Further, a strong bond can be formed between the light emitting element and substrate, and damage to the light emitting element during encapsulating member removal can be prevented. Connecting terminal protrusions can also improve post-manufacture reliability of the light emitting device.

Preferably, the tops of the protrusions 3a have approximately the same shape as the electrodes of the attached light emitting element. This allows light emitting element to self-align with connecting terminal protrusions and simplifies the light emitting element mounting process.

The protrusions 3a can be formed by establishing protruding bumps on top of planar connecting terminals, by locally thickening the base material under the connecting terminals, by locally thickening the connecting terminals formed on top of planar base material, or by a combination of those methods.

The light emitting device of the present invention does not have to be provided with a substrate. For example, electrodes of a light emitting element (described later) can be exposed outside the light emitting device and serve as external connecting electrodes.

Light Emitting Element

The light emitting element may be mounted on the substrate in flip-chip manner. For example, the light emitting element is mounted on the first primary surface of the substrate with electrodes making contact with the connecting terminals on the first primary surface. A single light emitting device can incorporate a single light emitting element or a plurality of light emitting elements. The size, shape, and emission wavelength of the light emitting element(s) can be selected appropriately. In the case where a plurality of light emitting elements is mounted, they can be disposed in a random pattern or with a given periodicity or set pattern such as in a row. Further, a plurality of light emitting elements can be connected in series, in parallel, in a series connection of parallel connected elements, or in a parallel connection of series connected elements.

The light emitting element incorporates at least a semiconductor stack. For example, the semiconductor stack can be a first semiconductor layer (e.g. an n-type layer), a light emitting (active) layer, and a second semiconductor layer (e.g. a p-type layer) stacked in that order and having light emitting properties. The thickness of the semiconductor stack is preferably on the order of 30 µm or less, and more preferably 15 µm or less or 10 µm or less. Further, one side of the semiconductor stack (e.g. the second semiconductor layer side) has both a first electrode (negative or positive) that electrically connects to the first semiconductor layer and a second electrode (positive or negative) that electrically connects to the second semiconductor layer.

The n-type or p-type and material for the first and second semiconductor layers are not particularly limited. For example, the first and second layers can be various semiconductor materials such as III-V group compounds or II-VI group compounds. Specifically, nitride semiconductors such as $In_xAl_yGa_{1-x-y}N$, ($0 \leq x$, $0 \leq y$, $x+y \leq 1$), and materials such as InN, AlN, GaN, InGaN, AlGaN, and InGaAlN can be used. Individual layers can have thickness and structure known within the art.

Normally, the semiconductor stack is semiconductor layers grown (or deposited) on top of an element substrate (distinct from the previously described device substrate). Insulating substrates such as sapphire ($Al_2O_3$) and spinel ($MgAl_2O_4$), and semiconducting substrates such as previously mentioned nitride semiconductors can be used as the element substrate. By using a transparent element substrate such as sapphire, the light emitting element can be used in a light emitting device without removing the substrate even in the case where it is mounted in flip-chip orientation. The thickness of the element substrate is, for example, preferably on the order of 190 µm or less, 180 µm or less and even more preferably 150 µm or less.

The element substrate can have a plurality of projections and recessions on its surface. With those projections and recessions, for example, a nitride semiconductor stack formed on top of the substrate can have a substrate-side (opposite from the electrode-side) surface with a plurality of projections and recessions that correspond to the geometry of the element substrate. Accordingly, projections and recessions can be established with a height (or depth) on the order of 0.5 µm to 2.0 µm and a pitch on the order of 10 µm to 25 µm. The element substrate can be 0° to 10° off-axis from given crystal planes such as the C-plane or A-plane. Further, insulating or semiconductor layers such as inter-layers, buffer-layers, or under-layers can intervene between the element substrate and the first semiconductor layer.

The element substrate, which is the substrate used to grow the semiconductor layers, can be removed from the semiconductor stack. For example, the semiconductor stack can be separated from the element substrate by methods such as laser lift-off method. Laser lift-off method is that laser light (e.g. KrF excimer laser light for GaN type semiconductors on sapphire substrate) irradiates from the element substrate side towards the semiconductor stack, and energy absorption causes semiconductor layer decomposition and separation at the substrate-semiconductor interface. The element substrate can be completely removed from the semiconductor stack, or it can be removed leaving some residue at the edges or corners of the semiconductor stack. The element substrate used to grow the semiconductor layers can be removed by processing prior to, or after mounting the light emitting element on the light emitting device substrate.

Removing the element substrate used to grow the semiconductor layers from the semiconductor stack allows a thinner and smaller light emitting device to be produced. Further, by removing layers that do not directly contribute to light emission, light emitted by the active layer is prevented from being absorbed in those layers. In addition, light scattering that originates in the element substrate can be prevented. This makes it possible to improve light emission efficiency and/or luminance.

While the shape as viewed in a plan view of the light emitting element or semiconductor stack is not particularly limited, a square shape or a shape close to square is preferable. Maximum size can be adjusted appropriately depending on the size or characteristics required for the resulting light emitting device. For example, the length of one side of a semiconductor stack can be on the order of several hundred microns to 2 mm. Specifically, the semiconductor stack can be on the order of 1400 µm×200 µm, 1100 µm×200 µm, or 900 µm×200 µm.

First and Second Electrodes

The first and second electrodes may be both formed on the same side of the semiconductor stack. With this configuration, the light emitting element can be mounted so that first and second electrodes opposite to connecting terminals of the device substrate in a flip-chip manner.

The first and second electrodes can be single or multiple layers of metals such as Au, Pt, Pd, Rh, Ni, W, Mo, Cr, and Ti or alloys of those metals. Specifically, the first and second electrodes can be metal film stacks in stacking order from the top of the semiconductor stack, Ti/Rh/Au, W/Pt/Au, Rh/Pt/Au, W/Pt/Au, Ni/Pt/Au, and Ti/Rh.

In addition, it is desirable to dispose a reflecting layer as a part of the first and second electrode that is near the first and second semiconductor layers respectively. Compared to other materials in the electrodes, the reflecting layer is preferably material that has a higher reflectivity with respect to light emitted from the light emitting layer. As materials that have high reflectivity, silver, silver alloys, and aluminum can be mentioned. For silver alloys, any of the materials well-known within the industry can be used. Although reflecting layer thickness is not particularly limited, a thickness, for example, on the order of 20 nm to 1 µm that can effectively reflect light output from the light emitting element is suggested. The larger the contact area of the reflecting layer with the first semiconductor layer and the second semiconductor layer the better.

Encapsulating Member

Encapsulating member is established at least surrounding the light emitting element, and encapsulating member on the upper surface of the light emitting element has a cavity with a perimeter that surrounds the light emitting element.

The encapsulating member can also serve to protect mechanically secure the light emitting element by covering the light emitting element.

Materials for the encapsulating member include ceramics, plastic resins, dielectrics, pulp, glass, or composites of those materials. Among those materials, plastic resin is preferable from the standpoint of ease in forming arbitrary shapes.

The encapsulating member can be a resin such as a thermosetting resin or a thermoplastic resin. Specifically, the encapsulating member can be resin such as epoxy resin group compounds, silicone resin group compounds, modified epoxy resin group compounds such as silicone-modified epoxy resin, modified silicone resin group compounds such as epoxy-modified silicone resin, hybrid silicone resin, polyimide resin group compounds, modified polyimide resin group compounds, polyphthalamide (PPA), polycarbonate resin, polyphenylene-sulfide (PPS), liquid crystal polymer (LCP), acrylonitrile butadiene styrene (ABS) resin, phenol resin, acrylic resin, and polybutylene terephthalate (PBT) resin.

The encapsulating member can be light-transmitting, but preferably incorporates light reflecting material that has reflectivity with respect to light from the light emitting element greater than or equal to 60%, and more preferably greater than or equal to 70%, 80%, or 90%. Accordingly, materials described above (e.g. resin) can include light reflecting material such as titanium dioxide, silicon dioxide, zirconium dioxide, potassium titanate, alumina, aluminum nitride, boron nitride, mullite, niobium oxide, barium sulfate, various rare earth element oxides (e.g. yttrium oxide and gadolinium oxide). It is also desirable to include additives such as light scattering material, pigments, and heat dissipation material. Accordingly, the encapsulating member can include fiber fillers such as glass fiber and wollastonite, and inorganic fillers such as carbon. Further, highly heat dissipative materials such as aluminum nitride can also be included. These additives can be, for example, on the order of 10 wt % to 95 wt % of the total encapsulating member, and 20 wt % to 80 wt % or 30 wt % to 60 wt % are preferable.

Light from the light emitting element can be efficiently reflected by including reflecting material within the encapsulating member. In particular, by using material with a higher reflectivity than the device substrate (e.g. using silicone resin that includes titanium dioxide with an aluminum nitride device substrate), the light extraction efficiency of the light emitting device can be improved with a substrate, which is reduced in size while maintaining handleability. In the case where only titanium dioxide is added as reflecting material, inclusion of 6 wt % of the encapsulating member is desirable.

While the shape established by the encapsulating member is not particularly limited, a circular pillar or column, a polygonal column such as a rectangular column, a circular truncated cone (frustum), a polygonal truncated cone such as a rectangular frustum, or outlines approximating those geometries are examples of possible encapsulating member shapes. Among those shapes, a form that is long and narrow in the lengthwise direction of the device substrate is preferable. A shape with surfaces that align with sides of the substrate and particularly with the short (width) direction of the substrate is preferable. This allows production of a miniaturized light emitting device.

Encapsulating member is established at least on the upper surface and surrounding the upper surface of the light emitting element. It is also desirable to cover the sides of the light emitting element and preferably encapsulating member is disposed surrounding, and in contact with the entire perimeter of the light emitting element. This prevents light from leaking out the sides and allows efficient extraction of light from the upper surface of the light emitting element. This can also reduce the amount of non-wavelength-converted light escaping from the sides of the light emitting element and results in a light emitting device with a light distribution having less color non-uniformity. It is also desirable to form the encapsulating member thickly in the lengthwise direction and thinly in the width direction of the light emitting device. This facilitates the thin outline feature of the light emitting device.

The encapsulating member can also fill the region between the flip-chip mounted light emitting element and the device substrate. This can increase the mechanical strength of the light emitting device. Encapsulating member disposed between the light emitting element and the device substrate can be different than the encapsulating member that covers the sides of the light emitting element. This allows appropriate attributes to be endowed to both the encapsulating member disposed on the sides of the light emitting element and to the encapsulating member disposed between the light emitting element and the device substrate. For example, encapsulating member disposed on the sides of the light emitting element can have high reflectivity, while encapsulating member disposed between the light emitting element and the device substrate can be a material that strongly bonds (adheres) those two parts.

In plan view (viewed from above the light extraction surface), the edges of the encapsulating member can lie inside or outside the edges of the device substrate. The encapsulating member may have a rounded shape in the lengthwise direction or in its orthogonal direction. In the case where the encapsulating member is formed in a long narrow shape, it is preferable for one edge in the lengthwise direction to coincide with a lengthwise edge of the device substrate. Specifically, it is desirable for at least one lengthwise side of the encapsulating member to lie in the same plane as a lengthwise side of the substrate, and it is more preferable for both lengthwise sides to be coincident with the lengthwise sides of the substrate. This allows the outer surfaces of the light emitting device to be set by the encapsulating member, allows light extraction surface area to be increased while restraining the size of the light emitting device, and enables greater light extraction efficiency and light output. While encapsulating member width direction edges can extend beyond substrate narrow side edges, those edges are normally disposed coincident with, or inward of the substrate narrow side edges. Here, coincident with (or lying in the same plane) is meant to include not only the strict (coplanar) definition, but also in the case of a somewhat rounded encapsulating member surface, means that some portion of the rounded surface is coplanar with a device substrate surface.

The size of the encapsulating member as viewed from above the light extraction surface preferably exceeds the area of the light emitting element, and in particular, encapsulating member outmost length is preferably on the order of 1.0 to 4.0 times the length of the light emitting element. Specifically, encapsulating member length is preferably on the order of 300 µm to 2000 µm, and more preferably 1000 µm to 1500 µm. The wall thickness of the encapsulating member (width of the encapsulating member from the side surface of the light emitting element to the outmost side surfaces of the encapsulating member as viewed from above the light extraction surface, in other words, the minimum width of encapsulating member on the light emitting element side surface) is, for example, on the order of 0 to 1000 µm, and preferably on the order of 50 µm to 500 µm or 100 µm to 200 µm.

In the case where the encapsulating member is a thermosetting resin, it can be formed by processing such as screen printing, potting, transfer molding, or compression molding.

To cover or encapsulate all side surfaces of the light emitting element and the surface opposite the device substrate, encapsulating member is formed after mounting the light emitting element on the substrate.

The encapsulating member cavity can be formed by a method suitably selected from a manufacturability or the type of encapsulating member used. For example, the cavity can be formed by methods such as masking and etching, abrasive blasting, or grinding by a drill etc. The cavity can also be formed by laser-ablation. Since laser-ablation can easily implement processing at the microscopic level, the cavity can be formed while controlling variation in its shape. Further, laser-ablation can form a cavity with a complex shape.

The plan view shape of the cavity can be a shape such as polygonal, circular, or elliptical. Preferably the shape of the cavity is approximately the same as the shape of the light emitting element as viewed from above. For example, in the case where the light emitting element has a rectangular shape, it is preferable for the cavity to have a rectangular shape. This makes it possible to increase the light extraction efficiency of the light emitting device while keeping device size small.

At least a part of the upper surface of the light emitting element is exposed at the bottom of the cavity. In particular, it is desirable to expose approximately the entire upper surface of the light emitting element at the bottom of the cavity. This can increase the light extraction efficiency of the light emitting device.

The bottom of the cavity can include encapsulating member as well as the upper surface of the light emitting element, light emitting device size can be kept small by making a cavity that has essentially the upper surface of the light emitting element as its entire bottom.

The upper surface of the light emitting element can be lying in the same plane as the bottom of the cavity, and the upper surface of the light emitting element can protrude from the bottom of the cavity. In other words, the upper surface of the light emitting element can be made higher than the bottom of the cavity.

Cavity depth can be, for example, 200 µm or less, 150 µm or less, 100 µm or less, and preferably 50 µm or less.

Figure 9:
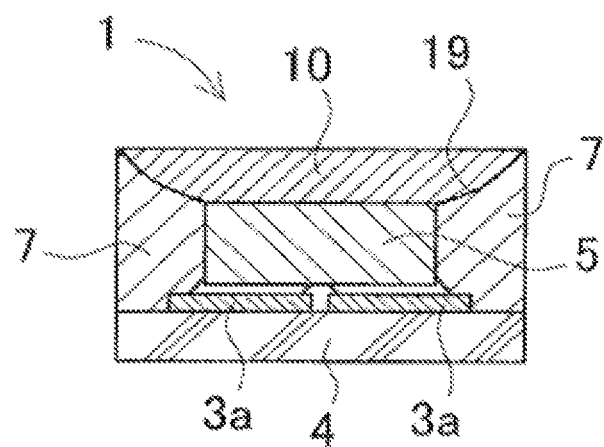
FIG. 9 is a schematic cross-section schematic showing a light emitting device curved cavity side-wall surfaces.

While the cavity side-walls can be vertical or inclined, inclined side-walls that widen towards the light extraction surface of the light emitting device are preferable to increase the light extraction efficiency. Cavity side-wall surfaces can also be curved as shown in FIG. 9, which can improve light extraction efficiency.

In the case where a plurality of light emitting elements are mounted in a single light emitting device, a single cavity can be formed on upper surfaces of a plurality of light emitting elements, or a plurality of cavities can be formed to establish one cavity over each light emitting element in the light emitting device. A plurality of cavities can also be formed over the upper surface of a single light emitting element.

Wavelength-Conversion Layer

As described above, encapsulating member on upper surface of the light emitting element has a cavity formed with a perimeter that surrounds the light emitting element. The cavity is the disposed at the light extraction surface of the light emitting device. A wavelength-conversion layer, which convert the wavelength of light emitted from the light emitting element, is formed in the cavity.

The wavelength-conversion layer can be a layer simply containing phosphor (or fluorescent material) that converts the wavelength of light from the light emitting element, or for example, it can be light-transmitting material that includes a phosphor (or fluorescent material). Additives that serve functions such as filling without voids, diffusing light, and adding color (pigmenting) can be included as deemed appropriate.

Substances that are at least excited by light emitted from the light emitting element and emit light with a different wavelength can be used as the phosphor. For example, the phosphor can be substances such as (1) aluminum-garnet based phosphors (e.g. cerium-activated yttrium-aluminum-garnet [YAG] based phosphors, or cerium-activated lutetium-aluminum-garnet [LAG] based phosphors); (2) europium and/or chrome-activated calcium aluminosilicate ($CaO-Al_2O_3-SiO_2$) based phosphors that include nitrogen; (3) europium-activated silicate based phosphors (e.g. (($Sr, Ba)_2SiO_2$)); (4) β-SiAlON based phosphors; (5) CASN ($CaAlSiN_3$:Eu) or strontium-included SCASN nitride based phosphors; (6) rare earth element nitrides such as $LnSi_3N_{11}$ based and LnSiAlON based phosphors (note, Ln is a rare earth element); (7) oxynitride based phosphors such as $BaSi_2O_2N_2$:Eu and $Ba_3Si_6O_{12}N_2$:Eu based; (8) $Mn^{4+}$ activated fluoride-complex based phosphors (e.g. KSF based phosphors such as $K_2SiF_6$:Mn); (9) sulfide based phosphors such as CaS (CaS:Eu), $SrGa_2S_4$ ($SrGa_2S_4$:Eu), $SrAl_2O_4$, and ZnS based; and (10) chlorosilicate based phosphors.

The phosphor can also be semiconductor material such as II-VI, III-V, or IV-VI compound semiconductors. Specifically, phosphors can be compound semiconductors including CdSe, core-shell type nanocrystal $CdS_xSe_{1-x}$/ZnS, highly dispersible nanocrystals such as GaP, and quantum dot light emitting materials. Since quantum dot phosphors may be unstable, particle surfaces can be covered with polymethyl methacrylate (PMMA), silicone resin, epoxy resin, or a hybrid based of those resins, or the quantum dot phosphors can be stabilized.

Accordingly, a light emitting device can be made that emits a mixture (i.e. a color mixture such as white light) of visible primary light from the light emitting element and visible secondary light, which is produced by phosphor included in the wavelength-conversion layer and has a different wavelength than the primary light. A light emitting device can also be made with phosphor that is excited by ultraviolet primary light from the light emitting element to emit visible secondary light. In the case where the light emitting device is used in an application such as backlight in a liquid crystal display, it is desirable to use phosphors that are excited by blue light and re-emit red light (e.g. KSF based phosphors) and green light (e.g. β-SiAlON based phosphors). This can widen the range of colors produced by a display using the light emitting device. Lighting (illumination) applications can employ combinations of light emitting elements that emit blue light, phosphors that emit yellow light, phosphors that emit red light, and light emitting elements or phosphors that emit blue-green light.

The form of the phosphor particulates can be, for example, crushed, spherical particles, hollow particles, or porous particles. Preferably, the average particle diameter is 50 µm or less, 30 µm or less, 20 µm or less, or 10 µm or less. Average particle diameter can be measured or computed using commercially available particle size measurement instruments, particle size distribution analyzers, or scanning electron microscope (SEM) imaging and analysis. The average particle diameter determined by these methods is expressed as "Fisher number," which is derived from the air permeability method using the Fisher Scientific™ Sub-Sieve Sizer™ (FSSS) apparatus.

As light-transmitting material for phosphor inclusion, materials such as high light-transmitting silicone resin, modified silicone resin, epoxy resin, phenol resin, polycarbonate resin, acrylic resin, polymethylpentene (TPX®) resin, polynorbornene resin, or a hybrid resin including one or more of those resins, and glass.

A plurality of wavelength-conversion layers can be formed. For example, the plurality of layers can include the same phosphor, or each layer can include a phosphor of different type, concentration, or composition, etc.

The light emitting device can have at least a first wavelength-conversion layer formed in the cavity on upper surface of the light emitting element (i.e. on the light extraction surface of the light emitting device), and a second wavelength-conversion layer that covers the first wavelength-conversion layer and includes a different type of wavelength-conversion material than the first wavelength-conversion layer.

As long as the second wavelength-conversion layer is formed on top of the first wavelength-conversion layer, it can be formed extending across and outside the cavity, or it can be formed within the cavity.

It is desirable for the second phosphor included in the second wavelength-conversion layer to have one or more of the following properties compared to the first phosphor included in the first wavelength-conversion layer: higher environmental resistance; superior water resistance; shorter emission wavelength; and more resistance to degradation. Specifically, it is desirable to form wavelength-conversion layers on upper surface of the light emitting element in order from layers that include phosphor with low environmental resistance at the bottom.

This protects a first phosphor which is poor resistance to environment, and can suppress degradation in the characteristics of the first phosphor. As a result, function of the first phosphor can be sufficiently realized and a high reliability, long lifetime light emitting device can be produced.

In the present specification, the emission wavelength of a phosphor is intended to mean the peak wavelength that is emitted. In general for a given excitation wavelength, more heat is released during re-emission in the case where longer wavelengths are produced. Accordingly, in the case where the emission wavelength of the second phosphor is shorter than that of the first phosphor (i.e. in the case where emission wavelength of the first phosphor is longer than that of the second phosphor), the first phosphor tends to generate more heat. However, by disposing the first wavelength-conversion layer (as the bottom layer) closer to other components such as the light emitting element and the light emitting device substrate, heat dissipation from the first phosphor can be increased.

Water resistance is meant to include resistance to humidity or moisture-related phenomena that change the initial state of the base compound of the phosphor and its phosphorescent properties such as dissolution, dissociation, deliquescence, or other chemical reaction. Hence, superior water resistance implies a small amount of change in phosphor properties.

As light-transmitting material, material can be appropriately selected from the resins containing non-light transmitting materials cited previously. Previously mentioned materials such as additives can be suitably selected to promote (fluid) filling without voids, diffusing light, and adding color (pigmenting).

It is preferable to use light-transmitting material in the second wavelength-conversion layer that has lower permeability to water vapor and gas (more hermetic) than the material used in the first wavelength-conversion layer. This enables effective protection of the first phosphor in the first wavelength-conversion layer. In addition, it is preferable for light-transmitting material that structures the first wavelength-conversion layer to have higher thermal conductivity and heat dissipating properties than material in the second wavelength-conversion layer. This can improve light emitting device reliability. Further, it is preferable for light-transmitting material in the first wavelength-conversion layer to have a refractive index that is approximately equal to or greater than that of the light-transmitting material in the second wavelength-conversion layer. This allows effective extraction of light from the wavelength-conversion layers and can improve light emitting device light extraction efficiency.

Particle diameter for previously mentioned nanocrystals and quantum dots phosphors are on the order of 1 nm to 100 nm (10 to 50 atoms). Use of these types of phosphors can suppress internal light scattering. Suppressing internal scattering can increase light distribution of the light emitting device in a direction perpendicular to the upper surface, and at the same time can restrain light directed towards the sides and bottom of the light emitting device. As a result, light extraction efficiency can be improved even more. For example, in the case where the light emitting device is used in a backlight application, the efficiency of light introduction into the backlight system can be increased even more. Since these types of nanocrystals and quantum dot phosphors typically have properties that are easily altered by exposure to moisture and gasses outside the light emitting device, they are preferably used as the first phosphor.

Phosphors selected from representative phosphor based groups including KSF, CaS, $SrGa_2S_4SrAl_2O_4$ or CASN, and quantum dots can be used as first phosphors. Phosphors selected from aluminum-garnet based phosphors, β-SiAlON based phosphors, and chlorosilicate based phosphors can be used as second phosphors.

Preferably, the average particle diameter of the first phosphor is on the order of 50 μm or less and the average particle diameter of the second phosphor is on the order of 30 μm or less. In other words, it is desirable for first phosphor particle size to be greater than second phosphor particle size (i.e. it is desirable for combination of the particle size of the second phosphor to be smaller than that of the first phosphor). This can reduce the amount of secondary light emitted from the first phosphor that is blocked by the second phosphor.

Methods of forming the wavelength-conversion layers in the cavity include techniques such as potting, light-transmitting material impregnation after electrophoretic phosphor deposition, compression molding, electrostatic spraying, printing, and adhesively attaching the first phosphor in sheet form. In the case where the first wavelength-conversion layer material is in liquid form for methods such as potting, compression molding, and printing, additives such as viscosity control agents (e.g. fine silica particles) can be included to adjust the viscosity or flow characteristics. Among the layer formation methods, a potting method that supplies slurry of phosphor in light-transmitting resin is preferable. This allows easy layer formation for arbitrary cavity locations, and makes it easy to control wavelength-conversion layer thickness and shape for stable light emitting device manufacturing processing.

Compared to methods such as spraying, the potting method can reduce stress applied to the phosphor during light emitting device manufacture. Consequently, even wavelength-conversion layers that include low energy absorption coefficient (low mechanical strength or hardness) phosphors can be reliably formed and disposed appropriately without damaging the form of the phosphor or degrading its properties. The potting method can also handle large diameter phosphor particles, which are difficult to manage with spraying methods, and can easily (and quickly) form layers with relatively large amounts of phosphor, which is also difficult to implement with spraying methods.

In the case where a wavelength-conversion layer is formed by a method such as potting with potting binder, which is the light-transmitting material, it is preferable to form the wavelength-conversion layer with higher phosphor concentration vertically close to the light emitting element. Therefore, it is desirable to adjust light-transmitting material viscosity considering the phosphor particle size. This can increase the amount of light emitted from the light emitting element that is directly incident on the phosphor to improve the wavelength-conversion efficiency and prevent color non-uniformity. This also increases the distance between the phosphor and the outer surface of the light emitting device to reduce ambient environmental effects due to moisture, gases, ultraviolet radiation, and oxygen etc. Further, concentration of phosphor at the bottom of the wavelength-conversion layer puts the phosphor closer to other light emitting device components such as the light emitting element, the device substrate, the encapsulate member and other components for effective dissipation of heat generated by the phosphor during light absorption and re-emission.

During wavelength-conversion layer formation, for example, after potting the wavelength-conversion layer compound, the device can be allowed to set for a given period or centrifugal force can be applied to settle the phosphor within the layer.

It is desirable for the concentration of phosphor included in the first wavelength-conversion layer to be lower than that included in the second wavelength-conversion layer. This can restrain primary and secondary light absorption by first phosphor disposed close to the light emitting element.

Thickness of the first wavelength-conversion layer is, for example, preferably 200 µm or less, and more preferably 100 µm or less. Thickness of the first wavelength-conversion layer is preferably greater than that of the second wavelength-conversion layer.

It is desirable to form the first wavelength-conversion layer such that the sides of the cavity (encapsulating member) partially or entirely cover the sides of the wavelength-conversion layer. Covering the sides of the first wavelength-conversion layer with encapsulating member avoids exposure of the first wavelength-conversion layer or first phosphor outside the light emitting device and can increase device reliability.

While any of the layer forming methods can be used to form the second wavelength-conversion layer, it is preferable to use of a spraying method to form the layer on top of the first wavelength-conversion layer. Either wet or dry spraying methods can be used.

Phosphor is not necessarily limited to inclusion within a wavelength-conversion layer and may be established in various locations within various materials in the light emitting device. For example, phosphor can be established as a phosphor layer coated or adhered on top of other light-transmitting materials that do not include phosphor.

The wavelength-conversion layer can also include filler such as diffusing agents or pigmentation. For example, silica, titanium oxide, zirconium oxide, magnesium oxide, glass, phosphor crystals or sintered material, and phosphor sintered with inorganic binder can be used. The refractive index of the filler can be adjusted as required. For example, the refractive index can be 1.8 or greater.

The particulate form of the filler can be crushed, spherical particles, hollow particles, or porous particles, etc. Average particle diameter is preferably 0.08 µm to 10 µm for high efficiency light scattering. Phosphor and/or filler composition on the order of 10 wt % to 80 wt % of total weight of the light-transmitting material is desirable.

In the case where a spraying method is used as the method of forming the wavelength-conversion layer, a pulsed spraying method, which ejects spray at intervals, is desirable. Ejecting spray at intervals can reduce the amount of phosphor sprayed in a given time. By slowly moving the spray nozzle while ejecting low quantities of spray, rough or uneven surfaces can be evenly coated. Further, compared to continuous spraying methods, the pulse method can reduce air flow induced in the ambient without reducing the ejection speed of slurry from the nozzle. This can dispense slurry under favorable conditions onto the surface being coated, and prevent the air flow generated by the spray from distributing the coated surface. As a result, a film coating can be formed that strongly binds phosphor particles to the surface of the light emitting element. Thin film particulate layers that include phosphor particles can be formed as a plurality of stacked layers. The precision of the film thickness can be improved by controlling the number of layers formed. In addition, uneven phosphor distribution can be suppressed, which allows uniformly wavelength-converted light to be emitted and avoids color non-uniformity in the light emitting device.

While the thickness of any wavelength-conversion layer is not particularly limited, it can be, for example, on the order of 1 µm to 300 µm, 1 µm to 100 µm, 2 µm to 60 µm, or 5 µm to 40 µm depending on cavity depth.

Particularly in the case where the light emitting device is used in backlight applications, these types of relatively thin wavelength-conversion layers can improve efficiency of light emitting device emission and backlight. For example, by increasing the amount of light directed to the light extraction surface, the efficiency of light introduction into the backlight system can be increased. Thin wavelength-conversion layers also reduce the quantity of light-transmitting resin in those layers. In the case where the light-transmitting resin has low heat dissipating properties, heat storage in the phosphor is reduced by lowering the percentage of resin in the wavelength-conversion layer. At the same time, a thin wavelength-conversion layer can increase the contact surface area of phosphor particles with the light emitting element as well as with other phosphor particles and establish heat transfer pathways. Consequently, the luminance efficiency of the light emitting device is enhanced by improving the phosphor heat dissipation. In a backlight application, a thin wavelength-conversion layer light emitting device can be mounted with its light extraction surface extremely close to the light guide of the backlight system. This can increase the intensity of luminance into the light guiding panel and increase the efficiency of the backlight system.

A wavelength-conversion layer can have a rough surface. Although a rough surface can be formed by any of the layer forming methods, when a plurality of (thin film) particulate layers, which include phosphor particles, are formed as described previously, convex and concave corresponding to the phosphor particles are reflected in (rough) geometry of the upper surface of the wavelength-conversion layer.

In the case where a plurality of cavities are formed in the light emitting device, wavelength-conversion layers in each of the cavities can be of either the same or different type. For example, wavelength-conversion layers that include different color emitting phosphors can be formed in the different cavities. Hence, a single light emitting device that emits different colors can be produced.

The following describes in detail a light emitting device 1 for the first embodiment based on FIGS. 1-6.

Figure 2:
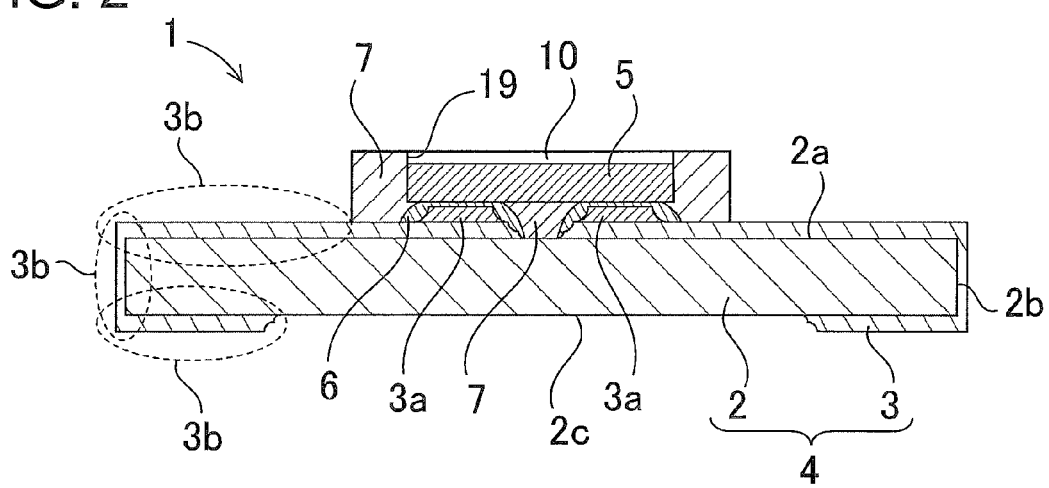
FIG. 2 is a schematic cross-section view of the light emitting device.
Figure 3:
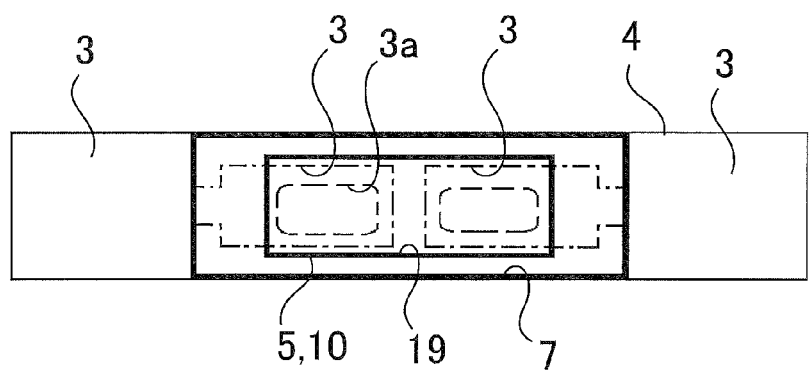
FIG. 3 is a schematic plan view of the light emitting device showing internal structure with broken lines.

As shown in FIGS. 1-3, the light emitting device 1 for this embodiment is structured with a device substrate 4 with a pair of connecting terminals 3 on the first primary surface of the base material 2, a light emitting element 5, encapsulating member 7 that is resin including light reflecting material, and a wavelength-conversion layer 10.

The substrate 4 is structured with a pair of Cu/Ni/Au layered in that order from the base material 2 connecting terminals 3 formed on surfaces of the base material, which are the first primary surface 2a, the end surfaces 2b positioned in the transverse direction, and the second primary surface 2c.

The base material 2 is formed into a rectangular, and includes, for example, glass fiber, spherical silica particles, spherical silicone particles, and carbon.

The pair of connecting terminals 3 are in mutual proximity at the center region of the upper surface 2a of the base material 2, and each connecting terminal 3 has a protrusion 3a that serves as the light emitting element connecting section. The protrusions 3a are formed with the copper layer. The protrusions 3a are disposed in positions corresponding to the pair of electrodes formed on the light emitting element 5 described later with size approximately the same as that of the electrodes.

Each of the two connecting terminals 3 is formed to extend continuously from the protrusion 3a, which is the light emitting element connecting section, over the upper surface 2a of the base material 2 and each of end surfaces 2b to the lower surface 2c. The part of a connecting terminal 3 that extends from the protrusion 3a to the lower surface 2c of the base material 2 with a U-shaped cross-section is the external connecting section 3b (refer to FIG. 2). A portion of lengthwise edges of the connecting terminals 3 coincide with lengthwise edges of the substrate 4 making the sides of the connecting terminals 3 coplanar with the sides of the device substrate 4 the lengthwise direction.

A light emitting element 5 is mounted in flip-chip manner on the connecting terminals 3 and more specifically on the protrusions 3a. The light emitting element 5 is a blue light emitting diode (LED) with nitride semiconductor stack (8 µm to 12 µm thick) formed on a sapphire substrate (approximately 150 µm thick) and a pair of positive and negative electrodes disposed on the surface of the semiconductor stack opposite from the sapphire substrate. The light emitting element 5 positive and negative electrodes are connected to the protrusions 3a on the device substrate 4 connecting terminals 3 with meltable bonding material 6 (approximately 20 µm thick), which is Au—Sn eutectic solder.

The sides of the encapsulating member 7 in the lengthwise direction are coincident with the sides of the substrate 4 in the lengthwise direction. Encapsulating member 7 is established on the first primary surface of the substrate 4 in a manner that contacts and covers all side surfaces of the light emitting element 5. Encapsulating member 7 is also established between the light emitting element 5 and the device substrate 4. Specifically, encapsulating member 7 is disposed between the light emitting element 5 and the meltable bonding material 6, which approximately completely covers the protrusions 3a, to essentially completely cover the meltable bonding material 6. This arrangement allows light to be efficiently extracted from the light emitting device 5 to upper surface of the light emitting device.

Figure 4A:
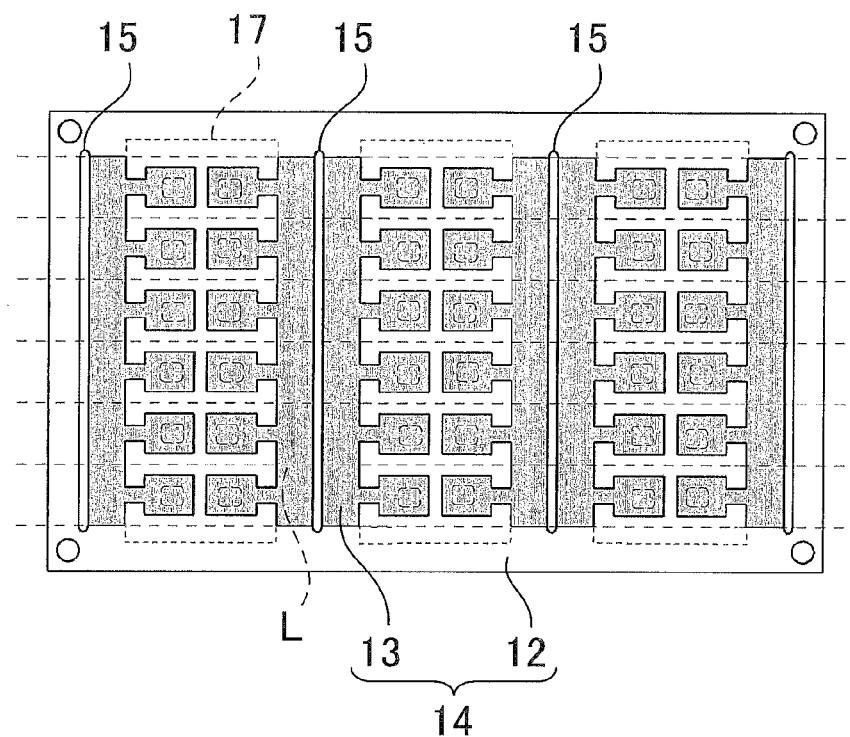
FIG. 4A is a schematic plan view used to illustrate the manufacturing method of the light emitting device of FIG. 1.
Figure 4B:
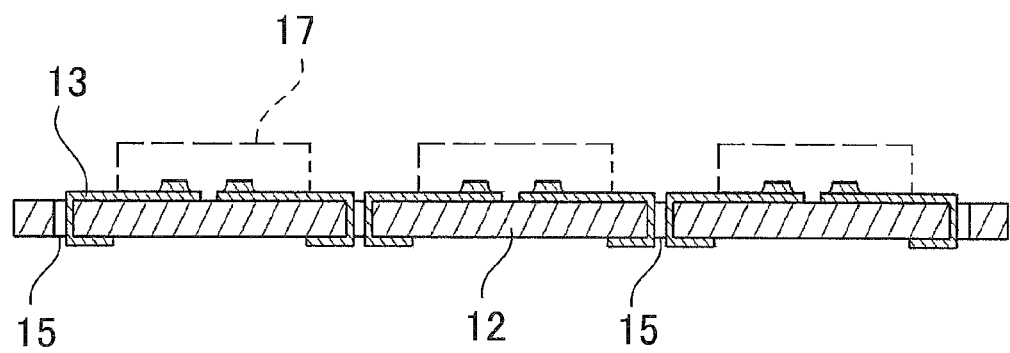
FIG. 4B is a schematic cross-section view of FIG. 4A.

As shown in FIGS. 4A and 4B, this type of light emitting device can be manufactured using a composite substrate 14 having composite connecting terminals 13 formed on base material 12. The composite substrate 14 is configured as a plurality of connected light emitting device substrates that become individual devices after a singularizing process. The composite substrate 14 has slits 15 that open regions of the base material 12 from the upper surface through to the lower surface. The composite connecting terminals 13 extend over the side-walls of the slits 15 and are established with a continuous structure over the upper surface and lower surface of the base material 12 of the composite substrate 14. Although the composite substrate 14 shown in FIGS. 4A and 4B produces eighteen light emitting devices, considering manufacturing efficiency, a larger composite substrate 14 can be used to produce many (e.g. several hundred to several thousand) light emitting devices.

Figure 5:
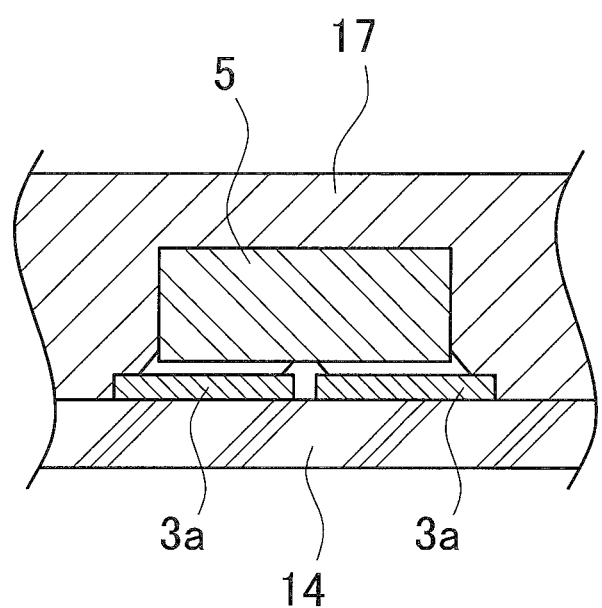
FIG. 5 is a schematic cross-section schematic used to illustrate the method of fabricating the cavity.

A plurality of light emitting elements 5 are bonded onto the composite substrate 14 and encapsulating members 17 is formed covering the upper and side surfaces of the plurality of light emitting elements 5 in a single step by transfer molding including encapsulation, forming and molding removal. At this point in processing, a single light emitting device appears as shown in FIG. 5.

Subsequently, the upper surface of the encapsulating member 17 is covered with a metal mask 18 at least having rectangular openings that align with the upper surface of each light emitting element 5. Blasting is performed above the mask to remove encapsulating member at the metal mask 18 openings, which align with the upper surfaces of the light emitting elements 5. This process forms cavities 19 with perimeters that surround the light emitting elements 5. In this embodiment, the perimeters of the cavities as viewed from above have substantially the same rectangular shape as the outline of the light emitting elements 5.

Figure 6A:
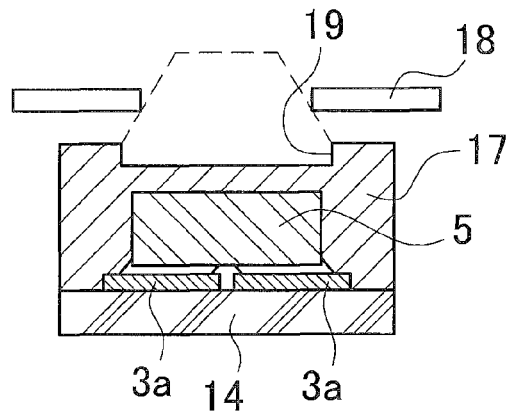
FIGS. 6A to 6F are schematic cross-section schematics showing cavity and wavelength-conversion layer structure.

FIG. 6A illustrates encapsulating member removal by blasting. The upper surface of the light emitting element 5 is element substrate, which is sapphire substrate. The cavity 19 is formed by removing at least the portion of the encapsulating member 7 on upper surface of the light emitting element 5 and part of the upper surface of the sapphire substrate. In the case where the cavity 19 is formed by blasting, the bottom of the cavity, which is the upper surface of the light emitting element 5, is formed with roughness due to abrasive particle impact. This roughness enables the wavelength-conversion layer 10, which covers the upper surface of the light emitting element 5, to be strongly attached to the upper surface. The cavity 19 can also be formed by laser-ablation removal of encapsulating member on upper surface of the light emitting element 5. Laser-ablation can process fine features unattainable with methods such as abrasive (sand) blasting and can form the cavity 19 with high precision.

Next, a wavelength-conversion layer 10 is formed inside the cavities 19, for example, by a pulse spraying method using a mask over the upper surface of the composite substrate 14. The wavelength-conversion layer 10 is formed by spraying slurry with 30 wt % LAG and SCASN phosphor in a silicone resin base into the cavities 19 where encapsulating member has been removed. Upper surfaces of the light emitting elements 5 exposed in the bottoms of the cavities 19 are covered with wavelength-conversion layer 10. The wavelength-conversion layer 10 is formed as a plurality of film layers by the spraying method. Subsequently, the wavelength-conversion layer 10 is hardened or cured.

Next, the composite substrate 14 incorporating light emitting elements 5 and processed encapsulating member 17 is cut in one direction along dicing lines L (refer to FIG. 4A). Due to the location of slit 15 openings, dicing in one direction further separates devices in the slit direction, and light emitting device 1 singularization can be accomplished with relatively fewer processing steps. The dicing process can be performed using tools such as a dicer or laser.

Figure 6B:
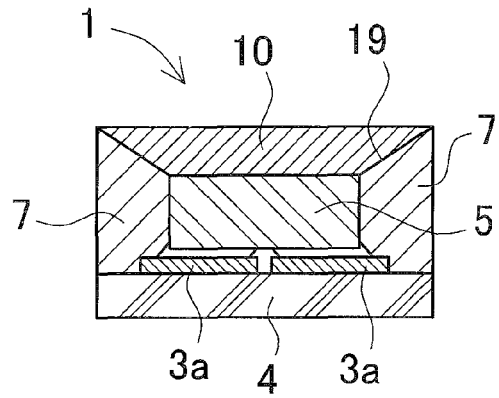
Figure 6C:
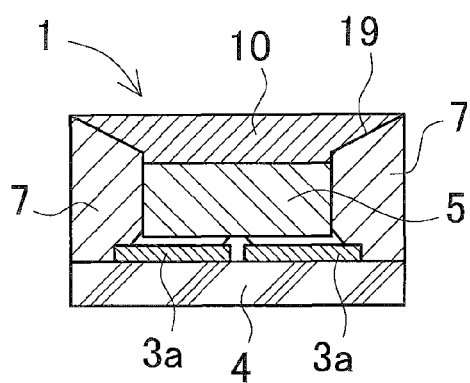
Figure 6D:
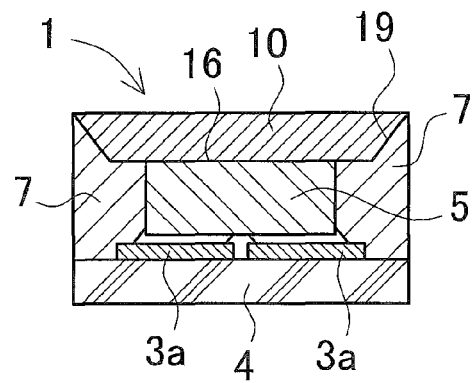

As shown in FIGS. 6B to 6D, light output angle from the light emitting device 1 can be adjusted to a desired angle by forming cavity 19 side-walls with inclination (other than vertical).

As shown in FIG. 6C, cavity 19 side-walls can have an approximate vertical section and a section that inclines at an angle from the top of the approximate vertical section.

Figure 6E:
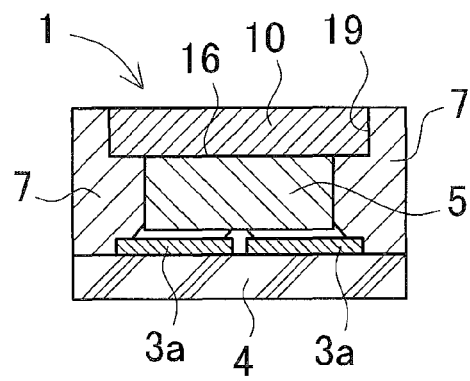

As shown in FIGS. 6D and 6E, a cavity 19 can be formed with a bottom that includes the upper surface 16 of the light emitting element 5 and encapsulating member surrounding that upper surface 16. Specifically, a cavity 19 can be formed with a bottom surface that is larger than the outline of the light emitting element 5 in the plan view.

Figure 6F:
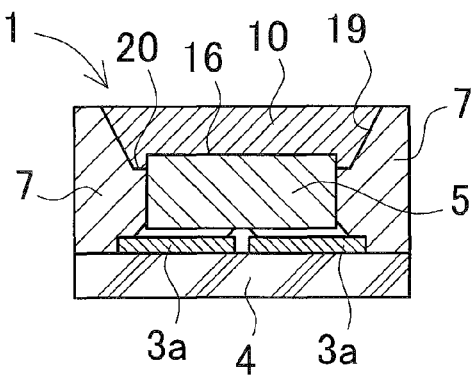

The upper surface 16 of the light emitting element 5 can be coplanar with the bottom 20 of the cavity 19 and can protrude above the bottom 20 as shown in FIG. 6F. In other words, the upper surface of the light emitting element 5 can be higher than the bottom 20 of the cavity 19.

Figure 7A:
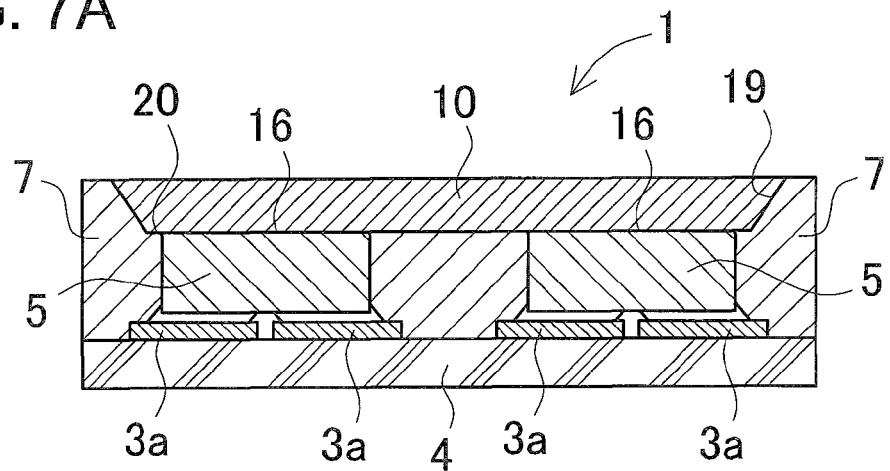
FIGS. 7A to 7C are schematic cross-section schematics showing cavity and wavelength-conversion layer structure.
Figure 7B:
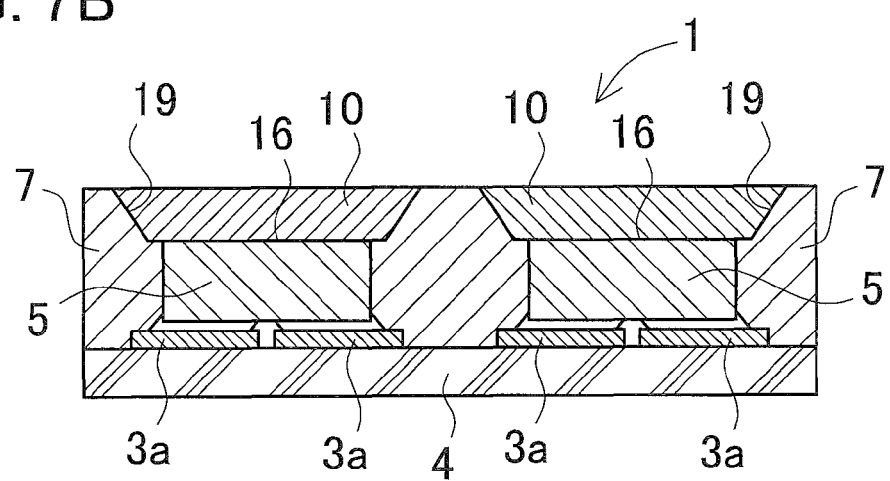

In the case where two light emitting elements 5 are included in a single light emitting device 1, a single cavity 19 can be formed over the upper surfaces of both light emitting elements 5 as shown in FIG. 7A, or individual cavities 19 can be formed over each light emitting element 5 as shown in FIG. 7B. The number of light emitting elements 5 is not limited to two and can also be three or more.

Figure 7C:
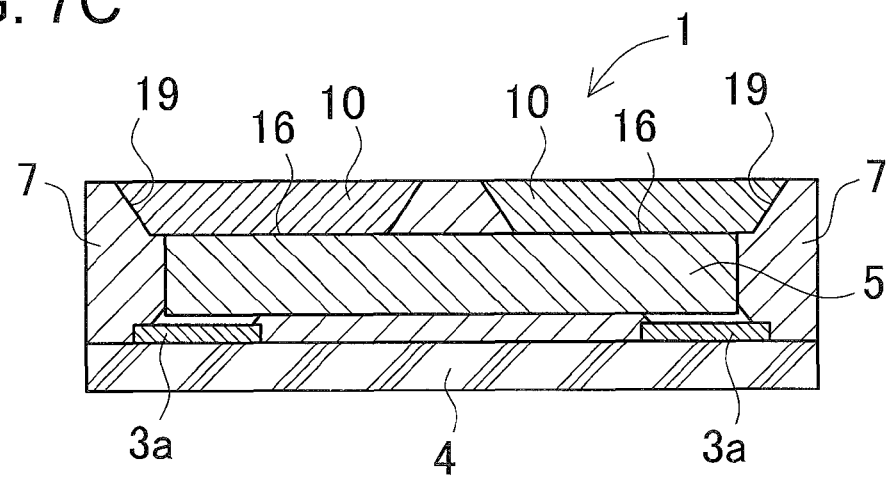

Further, in the case where a single light emitting element 5 is mounted in a single light emitting device 1 as shown in FIG. 7C, two cavities 19 can be formed over the single light emitting element 5. The number of cavities 19 is not limited to two and can also be three or more.

Figure 8:
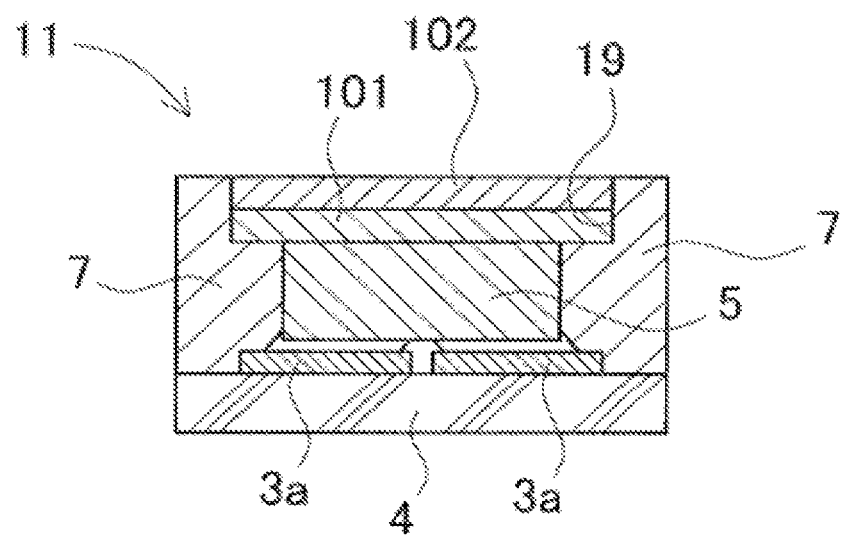
FIG. 8 is a schematic cross-section schematic showing wavelength-conversion layers of a light emitting device for the second embodiment of the present invention.

A light emitting device 11 for the second embodiment is described with reference to FIG. 8. Description, which is the same as that for the light emitting device 1 of the first embodiment, is omitted, and the same part number labels are used for parts that are the same.

In this second embodiment, a first wavelength-conversion layer 101, which includes a KSF phosphor that lacks resistance with respect to environmental exposure, is formed inside the cavity 19. A second wavelength-conversion layer 102, which includes a β-SiAlON phosphor, is also formed inside the cavity 19 covering the first wavelength-conversion layer 101. By stacking wavelength-conversion layers in order from the layer including the environmentally weakest phosphor at the upper surface of the light emitting element 5, the first wavelength-conversion layer 101 can be protected by the second wavelength-conversion layer 102.

In this embodiment, the first wavelength-conversion layer 101 is formed inside the cavity 19 by potting, which allows use of a phosphor that lacks resistance such as KSF.

The light emitting device of the present invention can be used in applications such as liquid crystal display backlighting, various illumination and lighting equipment, large-scale displays, and various display apparatus such as signs that present advertisements or travel destination information. The light emitting device can also be used in image acquisition equipment such as digital video cameras, facsimile (FAX) machines, copy machines, and scanners, as well as in projecting equipment. It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims. The present application is based on Application No. 2014-105650 filed in Japan on May 21, 2014, the content of which is incorporated herein by reference.

What is claimed is:

1. A method for manufacturing light emitting device comprising:

forming an encapsulating member at least on an upper surface and an upper surface perimeter of a light emitting element comprising an element substrate and semiconductor layers formed thereon;

forming a cavity with a perimeter that surrounds the light emitting element by removing a first part of the encapsulating member that is on the upper surface of the light emitting element while retaining a second part of the encapsulating member surrounding the perimeter of the cavity; and forming a wavelength-conversion layer inside the cavity to convert the wavelength of light emitted from the light emitting element, wherein the cavity is formed by covering the encapsulating member with a mask that has an opening that aligns with the light emitting element and removing the first part of the encapsulating member by removing, via the opening, a portion of the encapsulating member not covered by the mask at the opening.

2. The method for manufacturing the light emitting device according to claim 1 wherein the encapsulating member is a resin that includes light reflecting material.

3. The method for manufacturing the light emitting device according to claim 1 wherein the light emitting element is mounted on a device substrate in flip-chip manner.

4. The method for manufacturing the light emitting device according to claim 1 wherein the encapsulating member is also formed on the side surfaces of the light emitting element.

5. The method for manufacturing the light emitting device according to claim 1 wherein the mask is a metal mask and removed by blasting.

6. The method for manufacturing the light emitting device according to claim 1 wherein the cavity is formed by removing the portion of the encapsulating member on upper surface of the light emitting element by laser ablation.

7. The method for manufacturing the light emitting device according to claim 3 wherein the light emitting element has element substrate disposed on its upper surface, and after removing at least the encapsulating member on upper surface of the light emitting element to form the cavity, the element substrate is also removed.

8. The method for manufacturing the light emitting device according to claim 1 wherein the wavelength-conversion layer is formed by a spraying method.

9. The method for manufacturing the light emitting device according to claim 1 wherein the wavelength-conversion layer is formed by a potting method.

10. The method for manufacturing the light emitting device according to claim 1 wherein a plurality of wavelength-conversion layers are formed, and those layers are stacked in order from the layer that includes phosphor having the lowest resistance to environmental exposure disposed at the upper surface of the light emitting element.

11. The method for manufacturing the light emitting device according to claim 10 wherein among the plurality of wavelength-conversion layers, a first wavelength-conversion layer is formed by potting on the upper surface of the light emitting element, and a second wavelength-conversion layer is formed by spraying over the first wavelength-conversion layer.

12. The method for manufacturing the light emitting device according to claim 11 wherein the first wavelength-conversion layer includes KSF-based phosphor.

13. The method for manufacturing the light emitting device according to claim 1 wherein the element substrate is not removed when removing the first part of the encapsulating member.

14. The method for manufacturing the light emitting device according to claim 1 wherein the encapsulating member is removed by etching, blasting or laser-ablation.

15. The method for manufacturing the light emitting device according to claim 1 wherein the upper surface of the wavelength-conversion layer is substantially coplanar with the encapsulating member surrounding the cavity.

16. The method for manufacturing the light emitting device according to claim 1 wherein the cavity is defined by inclined or curved side-walls.

17. The method for manufacturing the light emitting device according to claim 1 wherein a plurality of the light emitting elements are encapsulated with the encapsulating member.

18. The method for manufacturing the light emitting device according to claim 1 wherein the light emitting device is side-view type.

19. The method for manufacturing the light emitting device according to claim 1 wherein the light emitting device is a top view type.

20. A method for manufacturing light emitting device comprising:
    forming an encapsulating member that has a top surface and that covers an upper surface and side surfaces of a light emitting element comprising an element substrate and semiconductor layers formed thereon;
    removing a first part of the encapsulating member that is on the upper surface of the light emitting element by continuously removing the first part of the encapsulating member from the top surface of the encapsulating material to the upper surface of the light emitting element, while retaining a second part of the encapsulating member on the side surfaces of the light emitting element to form a resulting cavity with a perimeter that surrounds the light emitting element; and
    forming a wavelength-conversion layer inside the resulting cavity to convert the wavelength of light emitted from the light emitting element.

21. The method for manufacturing the light emitting device according to claim 20 wherein the removal of the first part of the encapsulating material is performed by removing the encapsulating material directly above the upper surface of the light emitting element, while retaining an entirety of at least a portion of the encapsulating material at the top surface of the encapsulating material.

22. The method for manufacturing the light emitting device according to claim 20 wherein the encapsulating material is formed with the top surface having a height above the upper surface of the light emitting element, and the removal of the first part of the encapsulating material is performed by removing the encapsulating material directly above the upper surface of the light emitting element, while retaining at least a portion of the top surface of the encapsulating material.

23. The method for manufacturing the light emitting device according to claim 20 wherein the encapsulating material is formed to be in direct contact with the upper surface and the side surfaces of the light emitting element.

* * * * *